US012684820B2

(12) United States Patent
Su et al.

(10) Patent No.: US 12,684,820 B2
(45) Date of Patent: Jul. 14, 2026

(54) SEMICONDUCTOR STRUCTURE AND FABRICATION METHOD THEREOF

(71) Applicants:Semiconductor Manufacturing International (Shanghai) Corporation, Shanghai (CN); Semiconductor Manufacturing International (Beijing) Corporation, Beijing (CN)

(72) Inventors: Bo Su, Shanghai (CN); Hanzhu Wu, Shanghai (CN); Abraham Yoo, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 381 days.

(21) Appl. No.: 18/681,224

(22) PCT Filed: Aug. 5, 2021

(86) PCT No.: PCT/CN2021/110743
§ 371 (c)(1),
(2) Date: Feb. 5, 2024

(87) PCT Pub. No.: WO2023/010383
PCT Pub. Date: Feb. 9, 2023

(65) Prior Publication Data
US 2024/0313078 A1      Sep. 19, 2024

(51) Int. Cl.
H10D 30/67 (2025.01)
H10D 62/10 (2025.01)
(Continued)

(52) U.S. Cl.
CPC ..... H10D 30/6735 (2025.01); H10D 30/6713 (2025.01); H10D 30/6757 (2025.01);
(Continued)

(58) Field of Classification Search
CPC ........... H10D 30/6735; H10D 30/6713; H10D 30/6757; H10D 62/121; H10D 64/017;
(Continued)

(56) References Cited

U.S. PATENT DOCUMENTS 9,425,291 B1 * 8/2016 Balakrishnan ......... H10D 84/83
10,332,803 B1 * 6/2019 Xie .................... H10D 84/0167
(Continued)

FOREIGN PATENT DOCUMENTS

CN       111223779 A      6/2020

OTHER PUBLICATIONS

The World Intellectual Property Organization (WIPO) International Search Report for PCT/CN2021/110743 Apr. 24, 2022 5 pages (including English translation).

*Primary Examiner* — Mark W Tornow
(74) *Attorney, Agent, or Firm* — Anova Law Group, PLLC

(57)      ABSTRACT

A semiconductor structure and its fabrication method. First sacrificial layers are formed on a base substrate. Channel structures are formed on the first sacrificial layers. Each channel structure includes stacked channel stack layer(s). Each channel stack layer includes a second sacrificial layer and a channel layer. Dummy gate structures crossing the channel structures are also formed on the base substrate. Etching resistance of the first sacrificial layers is smaller than etching resistance of the second sacrificial layers. The channel structures and the first sacrificial layers on two sides of each dummy gate structure are removed to form first grooves. The first sacrificial layers at the bottoms of the
(Continued)

(a)

(b)

channel structures are removed to form second grooves connected to the first grooves. Isolation layers are formed in the second grooves; and source-drain doping layers are formed in the first grooves.

20 Claims, 11 Drawing Sheets

(51) Int. Cl.

| | | |
|---|---|---|
| *H10D 64/01* | (2025.01) | |
| *H10D 84/01* | (2026.01) | |
| *H10D 84/03* | (2025.01) | |
| *H10W 10/00* | (2026.01) | |
| *H10W 10/17* | (2026.01) | |

(52) U.S. Cl.
CPC ......... *H10D 62/121* (2025.01); *H10D 64/017* (2025.01); *H10D 64/018* (2025.01); *H10D 84/0188* (2025.01); *H10D 84/038* (2025.01); *H10W 10/014* (2026.01); *H10W 10/17* (2026.01)

(58) Field of Classification Search
CPC ............. H10D 64/018; H10D 84/0188; H10D 84/038; H10D 30/019; H10D 30/501; H10D 62/116; H10D 30/797; H10D 62/822; H10D 30/67; H10D 84/0165; H10W 10/014; H10W 10/17; B82Y 10/00
See application file for complete search history.

(56) References Cited

U.S. PATENT DOCUMENTS

| | | | |
|---|---|---|---|
| 2017/0062598 A1* | 3/2017 | Seo ........................ | H10D 30/43 |
| 2018/0090624 A1* | 3/2018 | Cheng ................ | H10D 30/6741 |
| 2018/0122900 A1* | 5/2018 | Cheng ................... | H10D 30/43 |
| 2018/0301564 A1* | 10/2018 | Kwon ................ | H10D 30/6713 |
| 2021/0335671 A1* | 10/2021 | Wang ................... | H10D 84/038 |
| 2022/0352335 A1* | 11/2022 | Zhu ...................... | H10D 62/121 |

* cited by examiner (a)                                                    (b)

240

410
400

200

280
230
220          } 210
510
110
100

240

140
410
400

200

280
230
220          } 210
510
110
100

(a)

(b)

SEMICONDUCTOR STRUCTURE AND FABRICATION METHOD THEREOF

CROSS-REFERENCE TO RELATED APPLICATION

This application is a national phase entry under 35 U.S.C § 371 of International Application No. PCT/CN2021/110743, filed Aug. 5, 2021, the content of which is incorporated herein by reference in its entirety.

TECHNICAL FIELD

The present disclosure generally relates to the field of semiconductor manufacturing technology and, more particularly, relates to a semiconductor structure and its fabrication method.

BACKGROUND

In semiconductor manufacturing, with the development trend of very large-scale integrated circuits, feature sizes of integrated circuits continue to decrease. To adapt to the smaller feature sizes, length of a channel of a metal-oxide-semiconductor field-effect transistor (MOSFET) is shortened accordingly. However, as the channel length of the device shortens, a distance between a source and a drain of the device also shortens, such that a gate structure's ability to control the channel becomes worse, and the gate voltage is more difficult to pinch off the channel, making the subthreshold leakage phenomenon (the so-called short-channel effect (SCE) more likely to occur.

Therefore, to better adapt to the requirements of feature sizes scaling down, semiconductor processes have gradually begun to transition from planar transistors to three-dimensional transistors with higher efficiency, such as gate-all-around (GAA) transistors. In a gate-all-around gate transistor, a gate surrounds an area where a channel is located from all sides. Compared with a planar transistor, the gate of the gate-all-around transistor has stronger control over the channel and is able to better suppress short-channel effect.

Technical Problems

The preset disclosure provides a semiconductor structure and its fabrication method, to improve performance of the semiconductor structure.

SUMMARY

To solve the above technical problems, the present disclosure provides a semiconductor structure. The structure includes: a base substrate including channel regions and whose normal direction of a surface is a longitudinal direction; isolation layers on the base substrate in the channel regions; channel layer structures located in the channel regions and suspended above the isolation layers; gate structures located on the base substrate and crossing the channel layer structures; and source-drain doped layers in the base substrate on two sides of each gate structure. Each channel layer structure includes one or more channel layers arranged at intervals in the longitudinal direction. Each gate structure includes a gate dielectric layer surrounding corresponding channel layers along an extending direction of the gate structure and a gate electrode layer located on the gate dielectric layer. Each gate structure is located on one corresponding isolation layer in one corresponding channel region. In an extending direction of the channel layer structures, the source-drain doped layers contact ends of the channel layer structures and ends of the isolation layers.

Another aspect of the present disclosure also provides a fabrication method of a semiconductor structure. In the method, a base substrate is provided. First sacrificial layers are formed on the base substrate. Channel structures are formed on the first sacrificial layers. Each channel structure includes one or more stacked channel stack layers. Each channel stack layer includes a second sacrificial layer and a channel layer located on the second sacrificial layer. Dummy gate structures crossing the channel structures are also formed on the base substrate. Etching resistance of the first sacrificial layers is smaller than etching resistance of the second sacrificial layers. The channel structures and the first sacrificial layers on two sides of each dummy gate structure are removed to form first grooves penetrating through the channel structures and the first sacrificial layers. The first sacrificial layers at the bottoms of the channel structures are removed through the first grooves, to form second grooves connected to the first grooves at the bottoms of the channel structures. Isolation layers are formed in the second grooves; and after forming the isolation layers, source-drain doping layers are formed in the first grooves.

Effective Benefits

Compared to existing technologies, the present disclosure has following benefits. In the semiconductor structure provided by the present disclosure the isolation layers may be formed on the base substrate at the bottom of the channel structures. In the channel regions, the gate structures may be located on the isolation layers. The isolation layers may effectively isolate the contact between the gate structures and the substrate in the channel regions, reducing the probability of leakage current between the gate structures and the base substrate in the channel regions. Also, compared with the solution of performing ion implantation on the substrate in the channel regions to isolate the gate structures and the substrate, embodiments of the present disclosure may avoid the problem of increasing parasitic capacitance caused by ion implantation into the substrate. Further, the source-drain doped layers may be located on the base substrate at two sides of each gate structure, and may contact ends of the isolation layers. Therefore, while adjacent source-drain doped layers are effectively isolated through the isolation layers, the source-drain doped layers may contact the base substrate, which may be beneficial to increasing the growth rate of the source-drain doped layers and improving the growth quality of the source-drain doped layers by reducing the defects in the growth process. Therefore, the operating performance of the semiconductor structure may be improved.

In the fabrication method of the semiconductor structure provided by the present disclosure, the first sacrificial layers may be formed on the substrate, and the first sacrificial layers may be removed through the first grooves. The second grooves connected to the first grooves may be formed at the bottoms of the channel structures. The isolation layers may be formed in the second grooves. By first forming the first sacrificial layers to occupy a space for the isolation layers, and then removing the first sacrificial layers to form the isolation layers, the growth of the channel structures on the first sacrificial layers may be improved and the material of the first sacrificial layers may be flexibly selected according to process requirements to improve the process compatibility of the first sacrificial layers. Further, after the second sacrificial layers are subsequently removed to form the gate structures, The gate structures may be formed on the isolation layers, and the isolation layers may effectively isolate the contact between the gate structures and the substrate, thereby reducing the probability of leakage current between the gate structures and the substrate. Also, compared with the solution of performing ion implantation into the substrate to isolate the gate structures and the substrate, embodiments of the present disclosure may avoid the problem of increasing parasitic capacitance caused by ion implantation into the substrate. Therefore, the operating performance of the semiconductor structure may be improved.

DETAILED DESCRIPTION

As described in the background, the performance of current semiconductor structures still needs to be improved.

Figure 1:
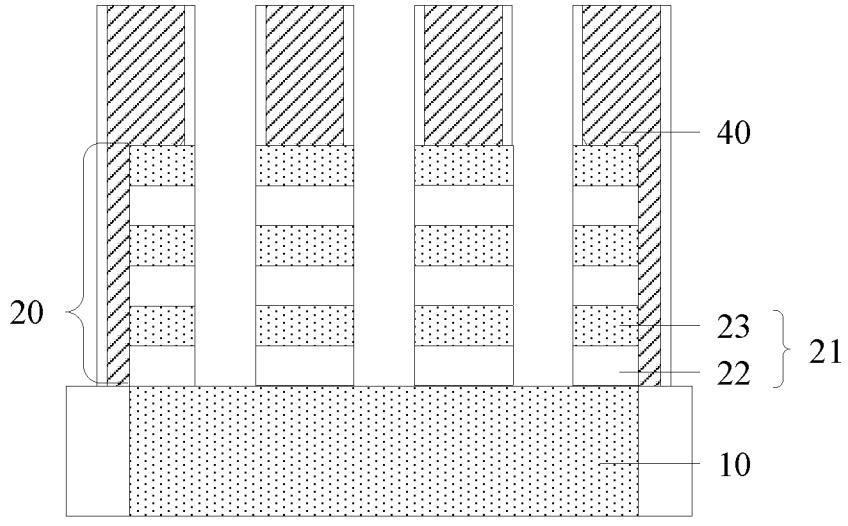
FIG. 1 to FIG. 2 illustrate structures corresponding to certain stages of a fabrication method of a semiconductor structure.
Figure 2:
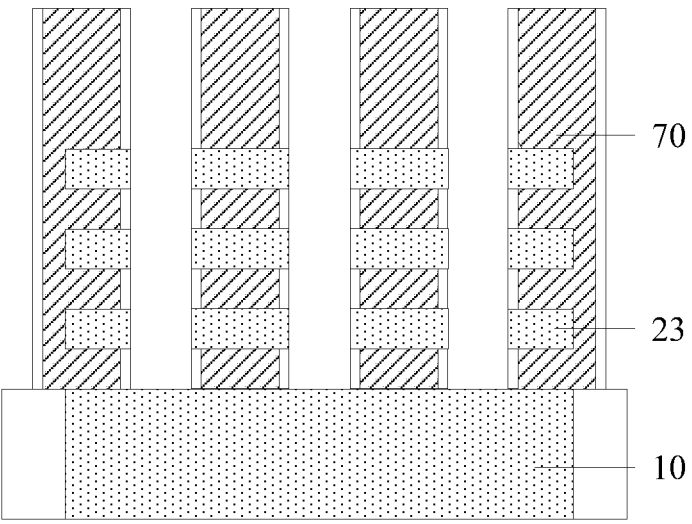

FIG. 1 to FIG. 2 illustrate structures corresponding to certain stages of a fabrication method of a semiconductor structure.

As shown in FIG. 1, a substrate 10 is provided. Ion implantation is performed on a top of the substrate 10 to form isolation regions (not shown in the figures). After forming the isolation regions, channel structures 20 are formed on the substrate 10 in the isolation region. Each channel structure 209 includes one or more channel stack layers 21. Each channel stack layer 21 includes a sacrificial layer 22 and a channel layer 23 on the sacrificial layer 22. Dummy gate structures 40 are formed on the substrate 10 crossing the channel structures 20. The dummy gate structures 40 cover a portion of side walls and apportion of tops of the channel structures 20.

As shown in FIG. 2, the dummy gate structures 40 are removed to form gate openings (not shown in the figures). Sacrificial layers 22 are removed through the gate openings, to expose surfaces of channel layers 23. After removing the sacrificial layers 22, gate structures 70 are formed in the gate openings to surround and cover the channel layers 23.

After forming the gate structures 70, the gate structures 70 are further in contact with the top surface of the substrate 10. To isolate the substrate 10 and the gate structures 70 and reduce leakage current of the semiconductor structure, the isolation regions are formed before forming the channel structures 20, to achieve the isolation between the substrate 10 and the subsequently formed gate structures 70. Further, to ensure the isolation effect of the isolation regions, ion implantation with a high density usually is performed to the top of the substrate 10.

The ion implantation with a high density performed to the top of the substrate 10 will increase the parasitic capacitance of the semiconductor structure and influence the performance of the semiconductor structure.

The present disclosure provides a fabrication method of a semiconductor structure, to at least partially alleviate the above problems. In the present disclosure, a substrate may be provided. First sacrificial layers may be formed on the substrate. Channel structures may be formed on the first sacrificial layers. Each channel structure may include one or more stacked channel stack layers. The one or more channel stack layers may include second sacrificial layers and channel layers on the second sacrificial layers. Dummy gate structures across the channel structures may be formed on the substrate. The dummy gate structures cover a portion of side walls and apportion of tops of the channel structures. The etching resistance of the first sacrificial layers may be less than the etching resistance of the second sacrificial layers. The channel structures and the first sacrificial layers on two sides of each dummy gate structure may be removed to form a first groove penetrating the channel structures and the first sacrificial layers. The first sacrificial layers at the bottoms of the channel structures may be removed through first grooves, and second grooves connected to the first grooves at the bottom of the channel structures may be formed. Isolation layers may be formed in the second grooves. After forming the isolation layers, source-drain doped layers may be formed in the first grooves.

In the fabrication method of the semiconductor structure provided by the present disclosure, the first sacrificial layers may be formed on the substrate, and the first sacrificial layers may be removed through the first grooves. The second grooves connected to the first grooves may be formed at the bottoms of the channel structures. The isolation layers may be formed in the second grooves. By first forming the first sacrificial layers to occupy a space for the isolation layers, and then removing the first sacrificial layers to form the isolation layers, the growth of the channel structures on the first sacrificial layers may be improved and the material of the first sacrificial layers may be flexibly selected according to process requirements to improve the process compatibility of the first sacrificial layers. Further, after the second sacrificial layers are subsequently removed to form the gate structures, The gate structures may be formed on the isolation layers, and the isolation layers may effectively isolate the contact between the gate structures and the substrate, thereby reducing the probability of leakage current between the gate structures and the substrate. Also, compared with the solution of performing ion implantation into the substrate to isolate the gate structures and the substrate, embodiments of the present disclosure may avoid the problem of increasing parasitic capacitance caused by ion implantation into the substrate. Therefore, the operating performance of the semiconductor structure may be improved.

The embodiments by the present disclosure will be described in following with reference to drawings, to illustrate the implementation and benefits of the present disclosure.

Figure 3:
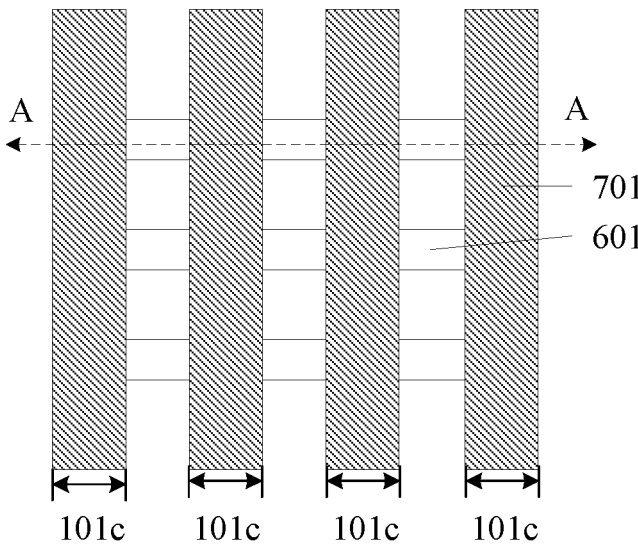
FIG. 3 to FIG. 4 illustrate an exemplary semiconductor structure according to various disclosed embodiments of the present disclosure.
Figure 4:
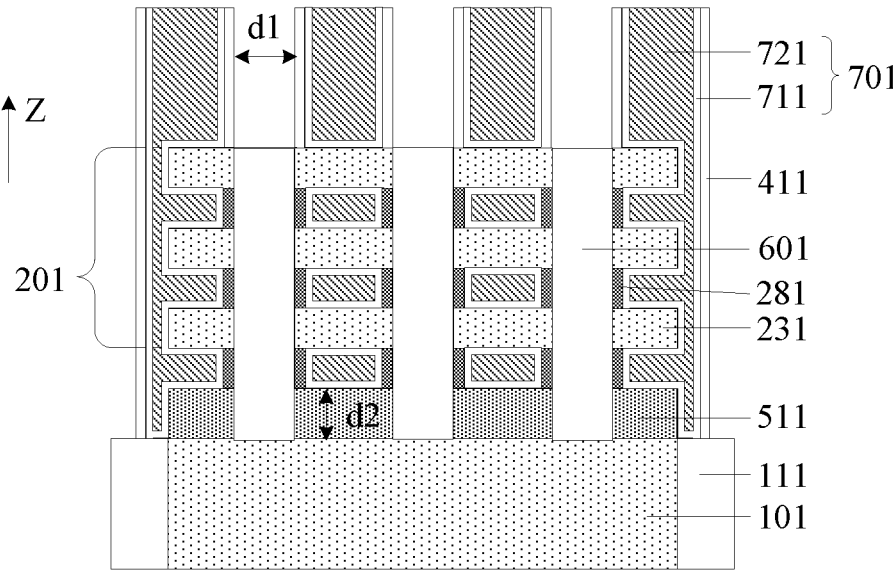

FIG. 3 and FIG. 4 illustrate structures of an exemplary semiconductor structure provided by one embodiment of the present disclosure. FIG. 3 is a top view of gate structures and source-drain doped layers, and FIG. 4 is a cross-sectional view along an AA direction in FIG. 3.

The semiconductor structure may include: a base substrate 101 including channel regions 101*c*, a normal direction of whose surface is a longitudinal direction (a Z direction in FIG. 4); isolation layers 511 on the base substrate 101 in the channel regions 101C; channel layer structures 201 on the channel regions 101*c* and suspended above the isolation layers 511, each of which includes one or more channel layers 231 arranged at intervals along the longitudinal direction; gate structures 701 on the base substrate 101 and across the channel layer structures 201, each of which includes a gate dielectric layer 711 surrounding corresponding channel layers 231 along an extending direction of the gate structures and a gate electrode layer 721 on the gate dielectric layer 711, and located on one corresponding isolation layer 511 in one corresponding channel region 101c; and source-drain doped layers 601 in the base substrate 101 on two sides of each gate structure 701. Along an extending direction of the channel layer structures 201, the source-drain doped layers 601 may be in contact with ends of the channel layer structures 201 and ends of the isolation layers 511.

The base substrate 101 may provide a process operation basis for the formation process of the semiconductor structure. The semiconductor structure may include a gate-all-around (GAA) transistor or a forksheet transistor.

The base substrate 101 may include a substrate (not shown).

In this embodiment, the substrate may be made of silicon. In other embodiments, the substrate may be made of other materials including germanium, silicon germanium, silicon carbide, gallium arsenide or indium gallium. The substrate may also be another substrate including a silicon-on-insulator substrate or a germanium-on-insulator substrate. The material of the substrate may be a material suitable for process requirements or easy to integrate.

It should be noted that the substrate 101 may also include fins (not labeled) located on the substrate.

In this embodiment, the substrate 101 may include the channel regions 101c, and the channel layer structures 201 in the channel regions 101c may be used as channels of transistors.

In this embodiment, the semiconductor structure may further include: a shallow trench isolation structure 111 located in the substrate 101.

The shallow trench isolation structure 111 may be used to achieve insulation between different devices. For example, in a CMOS manufacturing process, the shallow trench isolation structure 111 may be usually formed between an NMOS transistor and a PMOS transistor.

In this embodiment, the shallow trench isolation structure 111 may be located on the substrate exposed by the fins, and cover side walls of the fins.

The shallow trench isolation structure 111 may be made of an insulating material. In this embodiment, the material of the shallow trench isolation structure 111 may be silicon oxide.

The isolation layers 511 may be used to isolate the gate structures 701 and the substrate 101 of the channel regions 101c.

In the semiconductor structure provided by the present disclosure, in the channel regions 101c, the gate structures 701 may be located on the isolation layer s511. The isolation layers 511 may effectively isolate the contact between the gate structures 701 and the substrate 101 in the channel regions 101c, reducing the probability of leakage current between the gate structures 701 and the substrate 101 in the channel regions 101c. Also, compared with the solution of performing ion implantation on the substrate in the channel regions to isolate the gate structures and the substrate, embodiments of the present disclosure may avoid the problem of increasing parasitic capacitance caused by ion implantation into the substrate 101. Further, the source-drain doped layers 601 may be located on the substrate 101 at two sides of each gate structure 701, and may contact ends of the isolation layers 511. Therefore, while adjacent source-drain doped layers 601 are effectively isolated through the isolation layers 511, the source-drain doped layers 601 may contact the substrate 101, which may be beneficial to increasing the growth rate of the source-drain doped layers 601 and improving the growth quality of the source-drain doped layers 601 by reducing the defects in the growth process. Therefore, the operating performance of the semiconductor structure may be improved.

It should be noted that the thickness d2 of the isolation layers 511 should not be too large or too small. When the thickness d2 of the isolation layers 511 is too large, unnecessary process waste may easily be resulted. Further, before forming the isolation layers 511, the first sacrificial layers may be formed to occupy a space for the isolation layers 511, and then the first sacrificial layers may be removed. The isolation layers 511 may be formed after removing the first sacrificial layers. Therefore, when the thickness d2 of the isolation layers 511 is too large, the thickness of the first sacrificial layers may also be too large, which may easily cause unnecessary process waste and also increase the process difficulty of removing the first sacrificial layers. When the thickness d2 of the isolation layers 511 is too small, the isolation performance of the isolation layers 511 may be easily affected, making it difficult to completely isolate the gate structures 701 and the substrate 101 in the channel regions 101c and affecting the performance of the semiconductor structure. Therefore, in this embodiment, the thickness d2 of the isolation layers 511 may be set to 5 nm to 15 nm.

In this embodiment, the material of the isolation layer 511 may include a dielectric material, which may isolate the gate structures 701 and the substrates 101 of the channel regions 101c. Moreover, the process of the dielectric material may have a high compatibility, thereby reducing the impact of the isolation layers 511 on the process.

In one embodiment, the isolation layers 511 may be made of a material including one or more of silicon oxide or silicon nitride. Silicon oxide and silicon nitride may be able to effectively isolate the gate structures 701 and the substrates 101 of the channel regions 101c.

Each channel layer structure 201 may include the one or more channel layers 231 arranged at intervals along the longitudinal direction. The one or more channel layers 231 may be used as channels in the semiconductor structure.

In one embodiment, the one or more channel layers 231 may be made of a material including silicon, germanium, silicon germanium, or an III-V semiconductor material. For example, in one embodiment, the one or more channel layers 231 may be made of a material including silicon. In other embodiments, the one or more channel layers 231 may be made of a material according to the types and performance of the transistors.

In one embodiment, the one or more channel layers 231 may be made of a material same as the substrate. In some other embodiments, the one or more channel layers 231 may be made of a material different from the substrate.

The gate structures 701 may be used to control the on or off of the channels of the transistors.

The gate structures 701 may surround and cover the channel layers 231. Therefore, the tops, bottoms and side walls of the channel layers 231 may all be used as channels, which increases the area in the channel layers 231 used as channels, thereby increasing the operating current of the semiconductor structure.

One gate dielectric layer 711 may be used to isolate one corresponding gate electrode layer 721 from corresponding channel layers 231, and isolate the corresponding gate electrode layer 721 from the substrate 101 in one corresponding channel region 101c.

The gate dielectric layer 711 may be made of a material including one or more of $HfO_2$, $ZrO_2$, HfSiO, HfSiON, HfTaO, HfTiO, HfZrO, $Al_2O_3$, $SiO_2$ or $La_2O_3$. In this embodiment, the gate dielectric layer 711 may include a high-k gate dielectric layer, and the material of the high-k gate dielectric layer may include a high-k dielectric material. The high-k dielectric material may be a dielectric material whose relative dielectric constant is greater than the relative dielectric constant of silicon oxide. The high-k gate dielectric layer may be made of a material including $HfO_2$, $ZrO_2$, HfSiO, HfSiON, HfTaO, HfTiO, HfZrO or $Al_2O_3$, etc.

It should be noted that the gate dielectric layer 711 may also include a gate oxide layer, and the gate oxide layer may be located between the high-k gate dielectric layer and the corresponding channel layers 231. In one embodiment, the gate oxide layer may be made of a material including silicon oxide.

In this embodiment, one gate structure 701 may be a metal gate structure. Therefore, the gate electrode layer 721 may be made of a material including one or more of TiN, TaN, Ta, Ti, TiAl, W, AL, TiSiN and TiAlC.

The gate electrode layer 721 may include a work function layer (not shown) and an electrode layer (not shown) located on the work function layer. The work function layer may be used to adjust the threshold voltage of one corresponding transistor, and the electrode layer may be used to extract the electricity of the metal gate structure.

In other embodiments, the gate electrode layer may only include a work function layer.

In some other embodiments, according to process requirements, the gate structure may also be a polysilicon gate structure.

In some embodiments, the semiconductor structure may further include gate spacers 411 covering side walls of the gate structures 701.

The gate spacers 411 may protect the side walls of the gate structures 701. One gate spacer 411 may be a single-layer structure or a stacked-layer structure. The gate spacers 411 may be made of a material including one or more of silicon oxide, silicon nitride, SiC, SiCN, SiCNO, SiNO, BN, or BNC. In the present embodiment, the gate spacers 411 may be a single-layer structure and may be made of silicon nitride.

In one embodiment, a distance d1 between gate spacers 411 on opposite side walls of adjacent gate structures 701 may be larger than the thickness d2 of the isolation layers 511.

When forming the semiconductor structure, by depositing an isolation material layer from gaps between the gate spacers 411 on the opposite sidewalls of the adjacent gate structures 701, the isolation material layer may fill the space at the bottom of the channel layer structures 201, thereby forming isolation layers 511. At the same time, the isolation material layer may also be deposited on the side walls of the gaps between the gate spacers 411 on the opposite sidewalls of the adjacent gate structures 701. To better remove a portion of the isolation material layers on the side walls of the gaps, intervals may be kept between the isolation material layers on the side walls of the gaps. Therefore, the distance d1 between the gate spacers 411 on the opposite side walls of the adjacent gate structures 701 may be set to be larger than the thickness d2 of the isolation layers.

The source-drain doped layers 601 may be used as source regions or drain regions of the transistors. A doping type of one source-drain doped layer 601 may be the same as the channel conductivity type of one corresponding transistor.

In this embodiment, the source-drain doped layers 601 may be located in the substrate 101 on two sides of each gate structure 701. In the extending direction of the channel layer structures 201, the source-drain doped layers 601 may contact the ends of the isolation layers 511. Therefore, adjacent source-drain doped layers 601 may be effectively isolated by the isolation layers 511. Further, the source-drain doped layers 601 may be formed using an epitaxial growth process. When the source-drain doped layers 601 contact the substrate 101, the growth rate of the source-drain doped layers 601 may be increased, and the growth quality of the source-drain doped layers 601 may be improved, reducing defects generated during the growth process.

The doping type of one source-drain doped layer 601 may be the same as the channel conductivity type of the corresponding transistor. Specifically, when the substrate 101 is used to form an NMOS transistor, the dopant ions in the source-drain doped layer 601 may be N-type ions, and the N-type ions may include P ions, As ions or Sb ions. When the substrate 101 is used to form a PMOS transistor, the dopant ions in the source-drain doped layer 601 may be P-type ions, and the P-type ions may include B ions, Ga ions or In ions.

In one embodiment, when the substrate 101 is used to form an NMOS transistor, the material of the source-drain doped layer 601 may be Si or SiC doped with N-type ions, and the source-drain doped layer 601 may be used as the channel of the NMOS transistor. The corresponding channel region may provide tensile stress for the channel region of the NMOS transistor, which may be beneficial to improving the carrier mobility of the NMOS transistor. When the substrate is used to form a PMOS transistor, the material of the source-drain doped layer 601 may be Si or SiGe doped with P-type ions. The source-drain doped layer 601 may provide compressive stress for the channel region of the PMOS transistor, thereby helping to improve the carrier mobility of the PMOS transistor.

In one embodiment, the semiconductor structure may further include inner spacers 281. In the longitudinal direction, the inner spacers 281 may be located between adjacent channel layers 231, and between one channel layer 231 at the bottom and one corresponding isolation layer 511. Along the extending direction of the channel layer structures 201, the inner spacers 281 may be located between the gate structures 701 and the source-drain doped layers 601.

The inner spacers 281 may isolate the gate structures 701 and the source-drain doped layers 601, reducing the parasitic capacitance between the gate structures 701 and the source-drain doped layers 701.

The inner spacers 281 may be made of an insulating material. In one embodiment, the inner spacers 281 may be made of a material including SiN or SiCO.

FIG. 5 to FIG. 19 illustrate structures corresponding to certain stages of an exemplary fabrication method of a semiconductor structure provided by one embodiment of the present disclosure.

Figure 5:
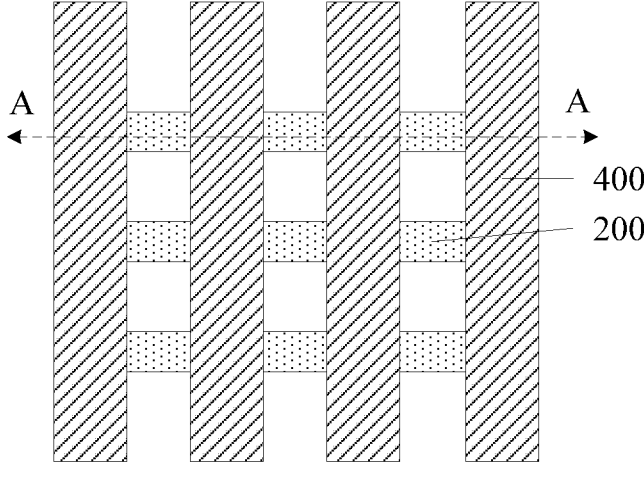
FIG. 5 to FIG. 19 illustrate structures corresponding to certain stages of a fabrication method of a semiconductor structure according to various disclosed embodiments of the present disclosure.
Figure 6:
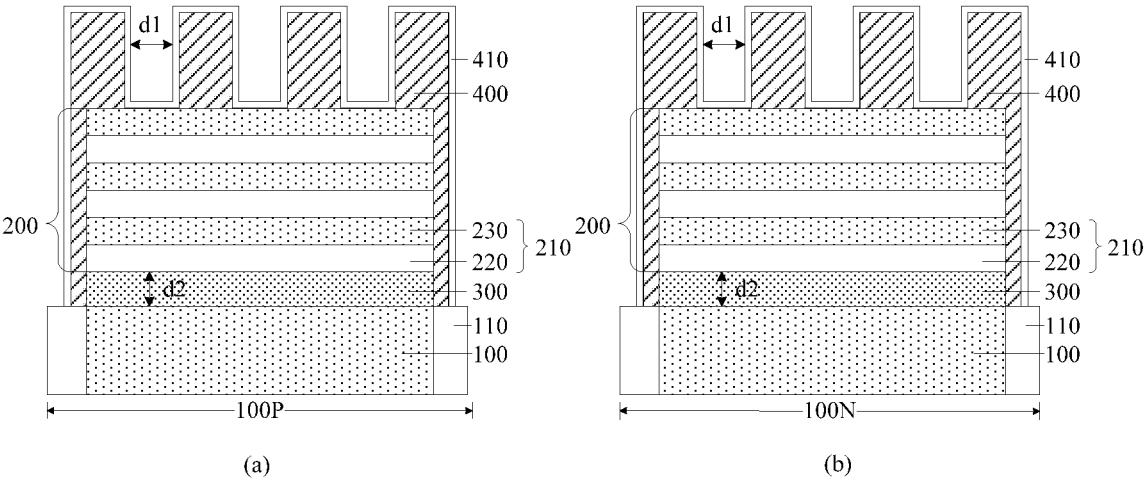

As shown in FIG. 5 which is a top view of dummy gate structures and fins and FIG. 6 which is a cross-sectional view along the AA direction in FIG. 5, a base substrate 100 may be provided. First sacrificial layers 300 may be formed on the base substrate 100 and channel structures 200 may be formed on the first sacrificial layers 300. Each channel structure 200 may include one or more stacked channel stack layers 210. Each channel stack layer 210 may include a second sacrificial layer 220 and a channel layer 230 on the second sacrificial layer 220. Dummy gate structures 400 crossing the channel structures 200 may be formed on the substrate 100. The dummy gate structures 400 may cover a portion of side walls and tops of the channel structures 200. The etching resistance of the first sacrificial layers 300 may be less than the etching resistance of the second sacrificial layers 220.

The base substrate 100 may provide a process operation basis for the formation process of the semiconductor structure. The semiconductor structure may include a gate-all-around (GAA) transistor or a forksheet transistor.

The base substrate 101 may include a substrate (not shown).

In this embodiment, the substrate may be made of silicon. In other embodiments, the substrate may be made of other materials including germanium, silicon germanium, silicon carbide, gallium arsenide or indium gallium. The substrate may also be another substrate including a silicon-on-insulator substrate or a germanium-on-insulator substrate. The material of the substrate may be a material suitable for process requirements or easy to integrate.

It should be noted that the base substrate 100 may also include fins (not labeled) located on the substrate.

As shown in FIG. 6 where FIG. 6(*a*) is a structure of a first device region and FIG. 6(*b*) is a structure of a second device region, in one embodiment, when providing the base substrate 100, the base substrate 100 may include a first device region 100P for forming a first transistor as shown in FIG. 6(*a*) and a second device region 100N for forming a second transistor as shown in FIG. 6(*b*).

In one embodiment, the first transistor and the second transistor may have different channel conductivity types, and the channel conductivity types may include N-type or P-type. As an example, the first transistor may be a PMOS transistor, and the second transistor may be an NMOS transistor. In other embodiments, the channel conductivity types of the first transistor and the second transistor may also be the same.

In one embodiment, when providing the base substrate 100, the base substrate 100 may include a shallow trench isolation structure 111 located in the substrate 101.

The shallow trench isolation structure 111 may be used to achieve insulation between different devices. For example, in a CMOS manufacturing process, the shallow trench isolation structure 111 may be usually formed between an NMOS transistor and a PMOS transistor.

In this embodiment, the shallow trench isolation structure 111 may be located on the substrate exposed by the fins, and cover side walls of the fins.

The shallow trench isolation structure 111 may be made of an insulating material. In this embodiment, the material of the shallow trench isolation structure 111 may be silicon oxide.

The channel layers 230 in the channel structures 200 may be used as channels of the semiconductor structure. The second sacrificial layers 220 may be used to provide a process basis for subsequent implementation of the suspended arrangement of the channel layers 230 and may be also used to occupy spaces for subsequently forming the gate structures. In a subsequent process, the second sacrificial layers 220 may be removed such that the channel layers 230 are suspended, and the gate structures may be formed between the channel layers 230 and the substrate 100 and between adjacent channel layers 230.

Surfaces of the channel layers 231 covered by the gate structures 701 may be used as the channels. Therefore, the tops, bottoms and side walls of the channel layers 231 may all be used as channels, which increases the area in the channel layers 231 used as channels, thereby increasing the operating current of the semiconductor structure.

In one embodiment, the channel layers 231 may be made of a material including silicon, germanium, silicon germanium, or an III-V semiconductor material. For example, in one embodiment, the one or more channel layers 231 may be made of a material including silicon. In other embodiments, the one or more channel layers 231 may be made of a material according to the types and performance of the transistors.

In one embodiment, the channel layers 231 may be made of a material same as the substrate. In some other embodiments, the channel layers 231 may be made of a material different from the substrate.

In one embodiment, the second sacrificial layers 220 may be made of a material including silicon germanium.

Silicon germanium and silicon may form a larger etching selectivity ratio, which is beneficial to subsequent removal of the second sacrificial layers 220 and reduces damage to the channel layers 230.

In other embodiments, the material of the second sacrificial layers may be selected from a material with an etching selectivity suitable for the channel layers according to the material of the channel layers, reducing the damage on the channel layers when the second sacrificial layers are subsequently removed.

The first sacrificial layers 300 may occupy a space for the subsequent formation of isolation layers.

It should be noted that the thickness d2 of the first sacrificial layers 300 should not be too large or too small. When the thickness d2 of the first sacrificial layers 300 is too large, unnecessary process waste may easily be resulted. Further, the first sacrificial layers 300 may occupy a space for the subsequent formation of isolation layers, and then the first sacrificial layers may be removed. The isolation layers 511 may be formed after removing the first sacrificial layers. Therefore, when the thickness of the first sacrificial layers is too large, the thickness of the isolation layers may also be too large, which may easily cause unnecessary process waste and also increase the process difficulty of removing the first sacrificial layers. When the thickness d2 of the first sacrificial layers 300 is too small, the thickness of the isolation layers 511 subsequently formed may be also too small and the isolation performance of the isolation layers 511 may be easily affected, making it difficult to completely isolate the gate structures 701 and the substrate 101 in the channel regions 101*c* and affecting the performance of the semiconductor structure. Therefore, in this embodiment, the thickness d2 of the first sacrificial layers 300 may be set to 5 nm to 15 nm.

In this embodiment, the etching resistance of the first sacrificial layers 300 may be less than the etching resistance of the second sacrificial layers 220, which is beneficial to the subsequent removal of the first sacrificial layers 300 and reducing the damage to the second sacrificial layers 220 when subsequently removing the first sacrificial layers 300.

It should be noted that the etching selectivity ratio of the first sacrificial layers 300 and the second sacrificial layers 220 should not be too small. When the etching selectivity ratio between the first sacrificial layers 300 and the second sacrificial layers 220 is too small, the second sacrificial layers 220 may be easily damaged during the subsequent removal of the first sacrificial layers 300, or even the second sacrificial layers 220 may be removed together. When forming the isolation layers, the isolation layers may also be filled between the adjacent channel layers 230 in the longitudinal direction, thereby affecting the formation of the gate structures between the adjacent channel layers 230 in the longitudinal direction and further affecting the performance of the semiconductor structure. Therefore, the etching selectivity ratio of the first sacrificial layers 300 and the second sacrificial layers 220 may be set to be larger than 10.

In one embodiment, the first sacrificial layers 300 may be made of a material including a semiconductor material, which is beneficial to the epitaxial growth of the first sacrificial layers 300 on the base substrate 100 and also beneficial to the epitaxial growth of the channel structures 200 on the first sacrificial layers 300. Therefore, the process compatibility of the first sacrificial layers 300 may be improved, such that the first sacrificial layers 300 and the channel structures 200 may be grown on the base substrate 100 using an epitaxial growth process in the same process.

In one embodiment, the first sacrificial layers 300 may be made of a material including $Si_{1-y}Ge_y$, and the second sacrificial layers 220 may be made of a material including $Si_{1-x}Ge_x$, where x<y. That is, the molar ratio between Ge and Si in the first sacrificial layers 300 may be larger than the molar ratio of Ge and Si in the second sacrificial layers 220, such that the etching resistance of the first sacrificial layers 300 is smaller than the etching resistance of the second sacrificial layers 220.

In one embodiment, in $Si_{1-y}Ge_y$ of the first sacrificial layers 300, y should not be too small. When the y value in the material $Si_{1-y}Ge_y$ of the first sacrificial layers 300 is too small, the etching resistance of the first sacrificial layers 300 may be too large, and the first sacrificial layers 300 may not be easily etched. Subsequent removal of the first sacrificial layers 300 may be difficult. Therefore, in one embodiment, in the material $Si_{1-y}Ge_y$ of the first sacrificial layers 300, $y \geq 0.4$.

In one embodiment, in the material $Si_{1-x}Ge_x$ of the second sacrificial layer 220, x should not be too large or too small. Since the channel layers 230 are obtained by epitaxial growth on the second sacrificial layers 220, when the x value in the material $Si_{1-x}Ge_x$ of the second sacrificial layers 220 is too large, the concentration of Ge in the second sacrificial layers 220 may be too high. When forming the channel layers 230, the transition layers required to transition from the material of the second sacrificial layers 220 to the material of the channel layers 230 may be too thick, resulting in the effective thickness of the channel layers 230 is too small. The quality of the channel layers 230 may be affected, thereby affecting the performance of the semiconductor structure. When the x value in the material $Si_{1-x}Ge_x$ of the second sacrificial layers 220 is too small, the etching resistance of the second sacrificial layers 220 may be too large, and the second sacrificial layers 220 may not be easily etched, causing difficulty in subsequent removal of the second sacrificial layers 220. Further, the etching selectivity ratio between the second sacrificial layers 220 and the channel layers 230 may be too small, thereby causing damage to the channel layers 230 during the removal of the second sacrificial layers 220 and affecting the performance of the semiconductor structure. Therefore, in one embodiment, in the material $Si_{1-x}Ge_x$ of the second sacrificial layer 220, $0.1 \leq x \leq 0.5$.

The dummy gate structures 400 may be used to occupy a space for subsequent formation of gate structures.

In one embodiment, one dummy gate structure 400 may be a stacked structure, including a dummy gate oxide layer (not shown) and a dummy gate layer (not shown) covering the dummy gate oxide layer.

As an example, the dummy gate oxide layer may be made of a material including silicon oxide, and the dummy gate layer may be made of a material including polysilicon.

In one embodiment, when providing the base substrate 100, gate spacers 410 covering the tops and sidewalls of the dummy gate structures 400 may be also formed on the base substrate 100.

When subsequently removing the isolation material layer in the gaps between the dummy gate structures 410, the gate spacers 410 may be used to protect the sidewalls of the dummy gate structures 400, thereby ensuring the formation quality of the subsequent gate structures and protecting the sidewalls of the gate structures after forming the gate structures.

One gate spacer 410 may be a single-layer structure or a stacked structure. The gate spacers 410 may be made of a material including one or more of silicon oxide, silicon nitride, silicon carbide, silicon carbonitride, silicon oxynitride, silicon oxynitride, boron nitride or carbon boron nitride. In this embodiment, one gate spacer 410 may have a single-layer structure, and the gate spacer 410 may be made of silicon nitride.

In one embodiment, when forming the gate spacers 410, the gate spacers 410 may conformally cover the dummy gate structures 400 and the channel structures 200.

In one embodiment, the distance d1 between the gate spacers 410 on opposite sidewalls of the adjacent dummy gate structures 400 may be larger than the thickness d2 of the first sacrificial layers 300.

Subsequently the first sacrificial layers 300 may be removed to form second grooves and an isolation material layer may be deposited from gaps between the gate spacers 411 on the opposite sidewalls of the adjacent dummy gate structures 400, such that the isolation material layer fills the second grooves at the bottom of the channel structures 200, thereby forming isolation layers 511. At the same time, the isolation material layer may also be deposited on the side walls of the gaps between the gate spacers 411 on the opposite sidewalls of the adjacent dummy gate structures 400. To better remove a portion of the isolation material layers on the side walls of the gaps, intervals may be kept between the isolation material layer on the side walls of the gaps. Therefore, the distance d1 between the gate spacers 411 on the opposite side walls of the adjacent dummy gate structures 400 may be set to be larger than the thickness d2 of the first sacrificial layers 300.

It should be noted that, unless otherwise specified, the subsequent drawings are used to represent any one of the first device region 100P and the second device region 100N.

Figure 7:
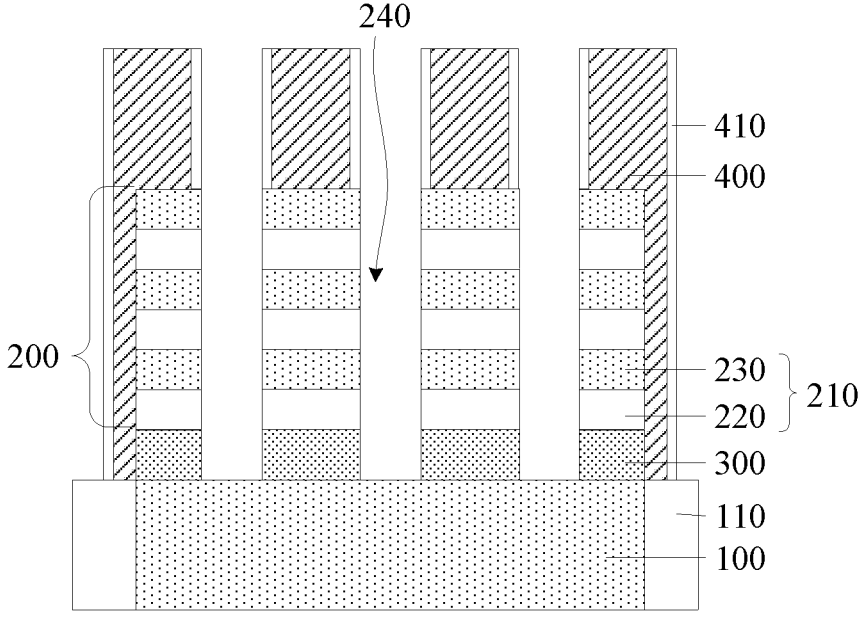

As shown in FIG. 7, the channel structures 200 and the first sacrificial layers 300 on two sides of each dummy gate structure 400 may be removed to form first grooves 240 penetrating the channel structures 200 and the first sacrificial layers 300.

The first grooves 240 may expose side walls of the first sacrificial layers 300 to prepare for the subsequent removal of the first sacrificial layers 300. Subsequently, an isolation layer is formed through the first trench 240. The first grooves 240 may also provide spatial locations for subsequent formation of source-drain doped layers.

In one embodiment, the first grooves 240 may be formed together in the first device region 100P and the second device region 100N for forming the source-drain doped layers. Compared to forming the first grooves in the first device region 100P and in the second device region 100N respectively, the process flow may be simplified, improving process efficiency.

In one embodiment, a dry etching process may be used to remove the channel structures 200 and the first sacrificial layers 300 on two sides of each dummy gate structure 400.

The dry etching process may be an anisotropic dry etching process. Therefore, selecting the dry etching process may be beneficial to reduce damage to the substrate 100 at the bottoms of the first grooves 240. At the same time, the dry etching may have more etching directionality and may be beneficial to improving the sidewall topography quality and dimensional accuracy of the first grooves 240.

In one embodiment, when removing the channel structures 200 and the first sacrificial layers 300 on two sides of each dummy gate structure 400, the gate spacers 410 on the tops of the channel structures 200 on two sides of each dummy gate structure 400 and the gate spacers 410 on the tops of the dummy gate structures 400 may be also removed.

Figure 8:
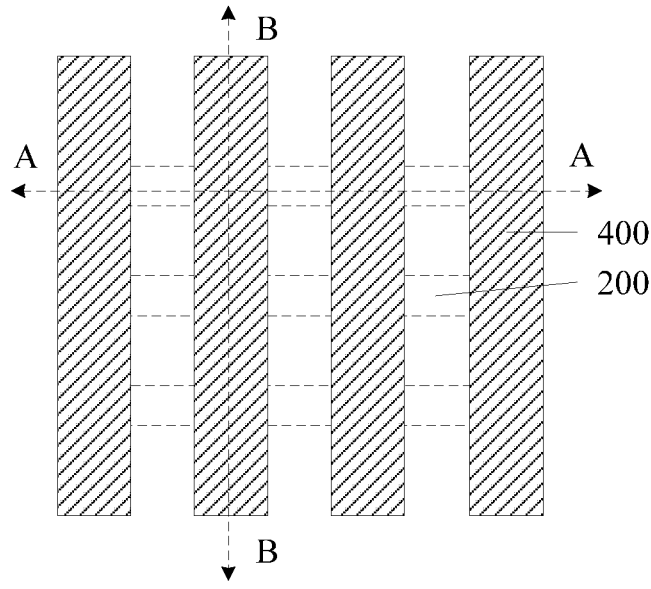
Figure 9:
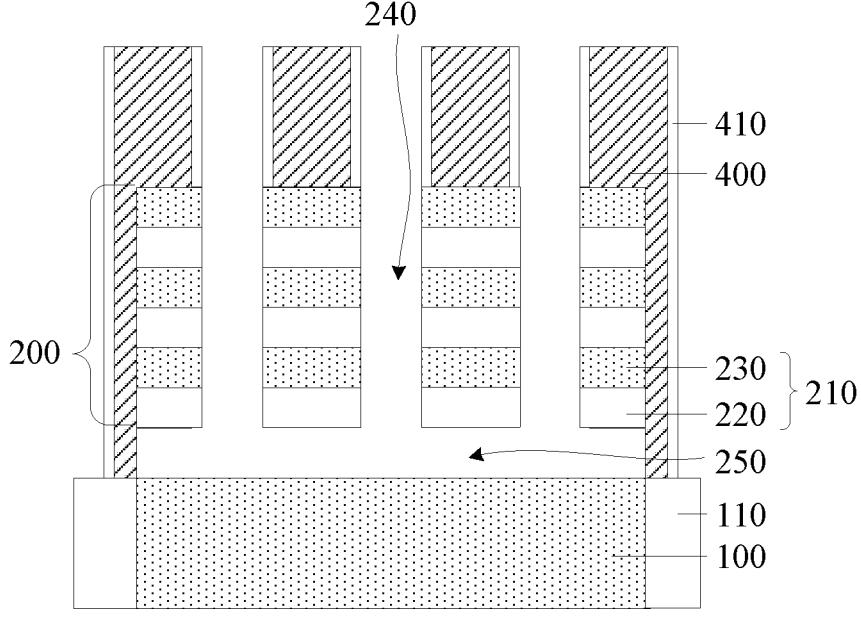
Figure 10:
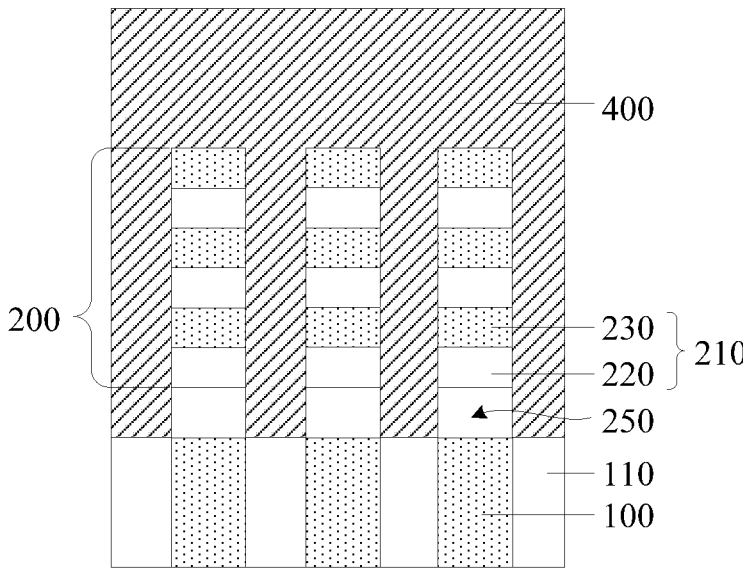

As shown in FIG. 8 which is a top view, FIG. 9 which is a cross-sectional view of FIG. 8 based on the AA direction, and FIG. 10 which is a cross-sectional view of FIG. 8 based on the BB direction, in one embodiment, the first sacrificial layers 300 at the bottoms of the channel structures 200 may be removed through the first grooves 240, to form second grooves 250 connected with the first grooves 240 at the bottoms of the channel structures 200.

The second grooves 250 may be used to provide a space for subsequent formation of the isolation layers.

It should be noted that, as shown in FIG. 10, the channel structures 200 may be supported by the dummy gate structures 400, such that the channel structures 200 may be suspended above the substrate 100 after the second grooves 250 are formed.

In one embodiment, when removing the first sacrificial layers 300 through the first grooves 240, an isotropic etching process may be used to remove the first sacrificial layers 300.

The isotropic etching process may be beneficial to completely removing the first sacrificial layer 300s.

In one embodiment, the isotropic etching process may include a plasma chemical reaction group etching process or a vapor phase etching process.

In one embodiment, the plasma chemical reaction group etching process may be a Certas etching process or a SiCoNi etching process, and the vapor phase etching process may also be a Certas etching process or a SiCoNi etching process.

The Certas etching process or SiCoNi etching process may have good isotropic characteristics, which is beneficial to completely removing the first sacrificial layers 300, and also the Certas etching process or SiCoNi etching process may have good etching selectivity ratio.

Figure 11:
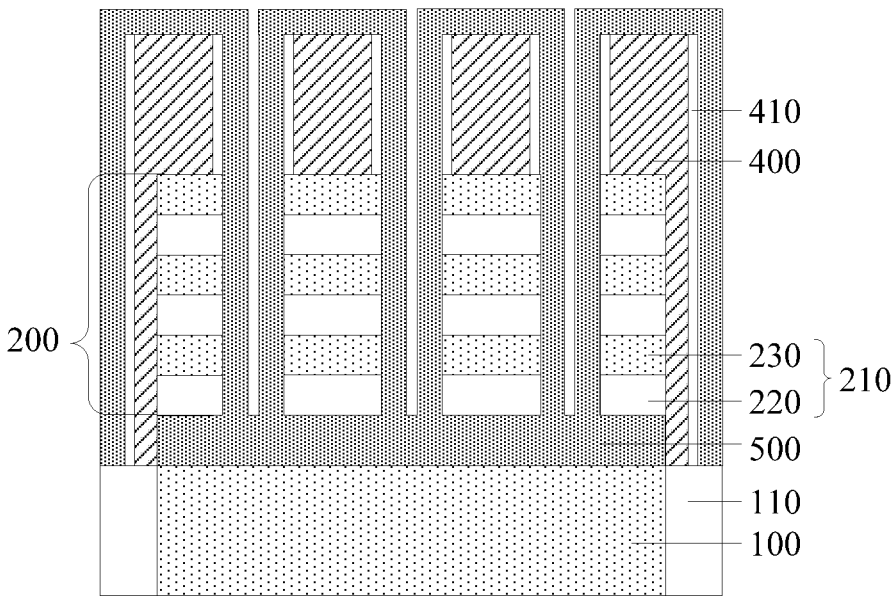
Figure 12:
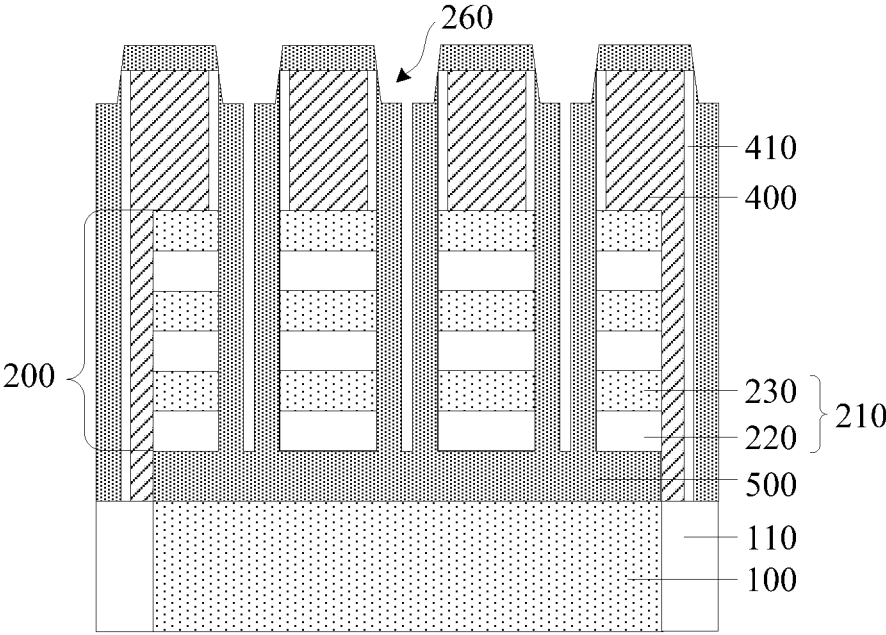
Figure 13:
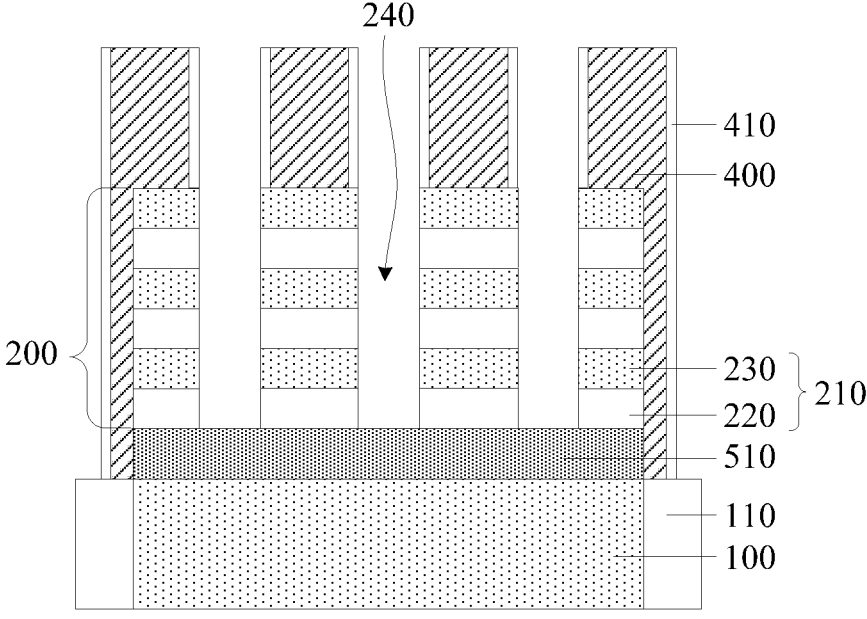

As shown in FIG. 11 to FIG. 13 which are cross-sectional views based on FIG. 9, isolation layers 510 may be formed in the second grooves 250.

By first forming the first sacrificial layers 300 to occupy the space for the isolation layers 510, and then removing the first sacrificial layers 300 to form the isolation layers 510, the growth of the channel structures 200 located on the first sacrificial layers 300 may be improved, and the material of the first sacrificial layers 300 may be flexibly selected according to process requirements to improve the process compatibility of the first sacrificial layers 300. Further, after the second sacrificial layers 220 are subsequently removed to form the gate structures, the gate structures may be formed on the isolation layers 510, and the isolation layers 510 may effectively isolate the contact between the gate structures and the substrate 100, thereby reducing the leakage current between the gate structures and the substrate 100. Moreover, compared to the solution of performing ion implantation on the substrate to isolate the gate structures and the substrate, the present disclosure may avoid the problem of increasing parasitic capacitance caused by ion implantation on the substrate 100. Therefore, the working performance of the semiconductor structure may be improved.

In this embodiment, the material of the isolation layer 511 may include a dielectric material, which may isolate the gate structures and the base substrates 100. Moreover, the process of the dielectric material may have a high compatibility, thereby reducing the impact of the isolation layers 511 on the process.

In one embodiment, the isolation layers 511 may be made of a material including one or more of silicon oxide or silicon nitride. Silicon oxide and silicon nitride may be able to effectively isolate the gate structures and the base substrates 100.

In one embodiment as shown in FIG. 11, forming the isolation layers 510 in the second grooves 250 may include: forming an isolation material layer 500 covering the side walls and tops of the dummy gate structures 400, the side walls of the channel structures 200, and a top of the base substrate 100 exposed by the first grooves. The isolation material layer 500 may also fill the second grooves 250.

The isolation material layer 500 may be used to form the isolation layers 510.

In one embodiment, when forming the isolation material layer 500, an atomic layer deposition process may be used to form the isolation material layer 500.

The isolation material layer 500 formed by the atomic layer deposition process may have good thickness uniformity and good step coverage capability, such that the isolation material layer 500 is able to well cover the side walls and tops of the dummy gate structures 400, and the side walls of the channel structures 200, while filling the second grooves 250 at the same time.

Correspondingly, the isolation material layer 500 may be made of a material including a dielectric material. For example, the isolation material layer 500 may be made of a material including one or more of silicon oxide or silicon nitride.

In one embodiment, when forming the isolation material layer 500, the isolation material layer 500 may also cover the gate spacers 410, such that the gate spacers 410 may protect the side walls of the dummy gate structures 400 when removing the isolation material layer 500 on the sidewalls of the dummy gate structures 400, thereby ensuring the formation quality of subsequent gate structures.

In one embodiment, the distance d1 between the gate spacers 410 on opposite sidewalls of the adjacent dummy gate structures 400 may be larger than the thickness d2 of the first sacrificial layers 300. Therefore, when forming the isolation material layer 500 covering the side walls and tops of the dummy gate structures 400, the side walls of the channel structures 200, and a top of the base substrate 100 exposed by the first grooves, there may be gaps between the isolation material layers 500 on the side walls of the adjacent dummy gate structures 400, which facilitates subsequent removal of the isolation material layer 500 on the side walls of the adjacent dummy gate structures 400.

As shown in FIG. 12 and FIG. 13, forming the isolation layers 510 in the second grooves 250 may further include: etching the isolation material layer 500 to preserve a portion of the isolation material layer 500 in the second grooves 250 and on the top of the base substrate 100 exposed by the first grooves 240 as the isolation layers 510. The isolation layers 510 may expose the side walls of the channel structures 200.

The isolation layers 510 may expose the side walls of the channel structures 200, to prepare for forming the source-drain doped layers in the first grooves 240.

As shown in FIG. 12, in one embodiment, etching the isolation material layer 500 may include: performing a first etching process on the isolation material layer 500, removing a portion of the height of the isolation material layer 500 between the adjacent dummy gate structures 400 and close to the tops of the dummy gate structures 400, to form openings 260.

The openings 260 may be used to expand the etching process window for removing the isolation material layer 500 between the adjacent dummy gate structures 400, and facilitate subsequent removal of the isolation material layer 500 higher than the bottoms of the channel structures 200.

In one embodiment, when performing the first etching process on the isolation material layer 500, a dry etching process may be used to remove a portion of the height of the isolation material layer 500 between the adjacent dummy gate structures 400 and close to the tops of the dummy gate structures 400.

The dry etching process may be an anisotropic dry etching process. Therefore, by selecting the dry etching process, the damage on the gate spacers 410 on the sides of the openings 260 may be reduced during the first etching process.

As shown in FIG. 13, etching the isolation material layer 500 may further include: after forming the openings 260, performing a second etching process on the isolation material layer 500, to remove the isolation material layer 500 higher than the bottoms of the channel structures 200.

The second etching process may remove a portion of the isolation material layer 500 higher than the bottoms of the channel structures 200, and a remaining portion of the isolation material layer 500 may be preserved as the isolation layers 510.

In one embodiment, when performing the second etching process on the isolation material layer 500, an isotropic etching process may be used to the portion of the isolation material layer 500 higher than the bottoms of the channel structures 200.

The depth of the first grooves 240 may be relatively large. Therefore, the isotropic etching process may be beneficial to completely removing the portion of the isolation material layer 500 higher than the bottoms of the channel structures 200.

In one embodiment, the isotropic etching process may include a plasma chemical reaction group etching process or a vapor phase etching process.

In one embodiment, the plasma chemical reaction group etching process may be a Certas etching process or a SiCoNi etching process, and the vapor phase etching process may also be a Certas etching process or a SiCoNi etching process.

The Certas etching process or SiCoNi etching process may have good isotropic characteristics, which is beneficial to completely removing the portion of the isolation material layer 500 higher than the bottoms of the channel structures 200. And also the Certas etching process or SiCoNi etching process may have good etching selectivity ratio.

It should be noted that during the second etching process, the portion of the isolation material layer 500 higher than the bottom of the channel structure 200 may be removed by controlling the etching time until exposing the top of the isolation material layer 500 at the bottoms of the channel structures 200.

It should also be noted that the present embodiment where the portion of the isolation material layer 500 higher than the bottoms of the channel structures 200 is completely removed after the second etching is performed is used as an example to illustrate the present disclosure. In some other embodiments, after the second etching is performed, a portion of the isolation material layer may remain on the sidewall of the first grooves. Therefore, only one additional process may be required to completely remove the portion of the isolation material layer higher than the bottoms of the channel structures.

Figure 14:
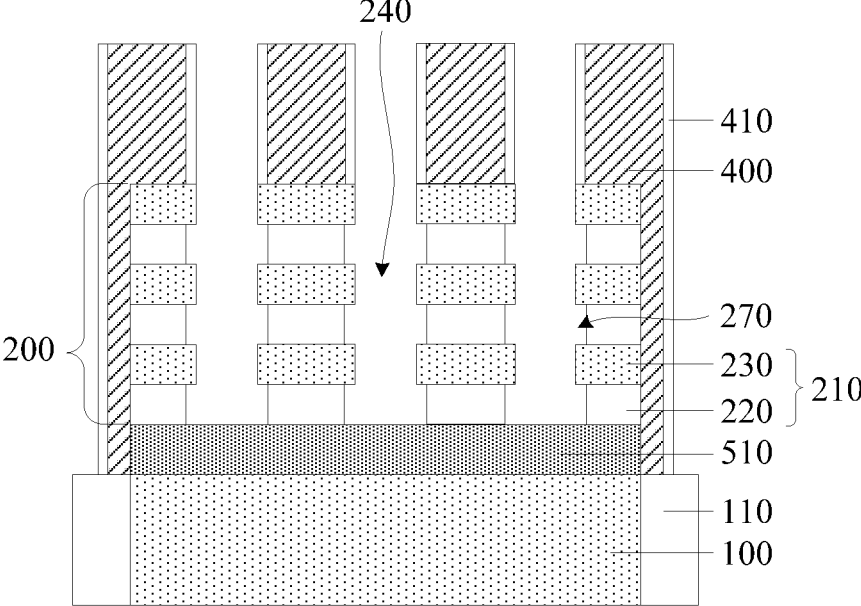

As shown in FIG. 14 which is a cross-sectional view based on FIG. 13, after forming the isolation layers 510 and before forming the source-drain doped layers subsequently, the method may further include: along a direction perpendicular to the sidewalls of the dummy gate structures 400, removing a portion of the second sacrificial layers 220 exposed by the side walls of the channel structures 200 through the first grooves 240, to form third grooves 270.

The third grooves 270 may provide spatial locations for forming inner spacers subsequently.

Figure 15:
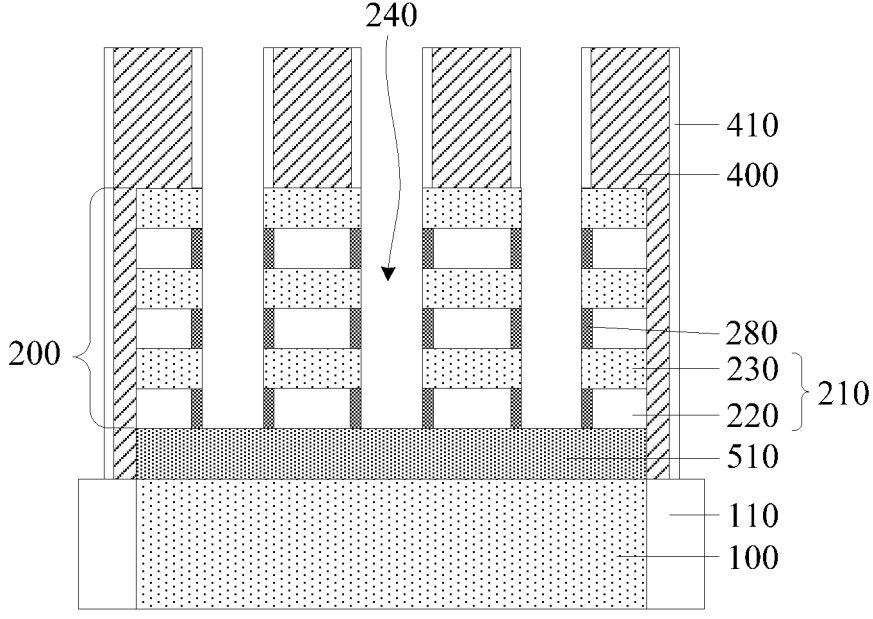

As shown in FIG. 15 which is a cross-sectional view based on FIG. 14, inner spacers 280 may be formed in the third grooves 270.

The inner spacers 280 may isolate the gate structures and the source-drain doped layers, reducing the parasitic capacitance between the gate structures and the source-drain doped layers.

The inner spacers 280 may be made of an insulating material. In one embodiment, the inner spacers 280 may be made of a material including SiN or SiCO.

Figure 16:
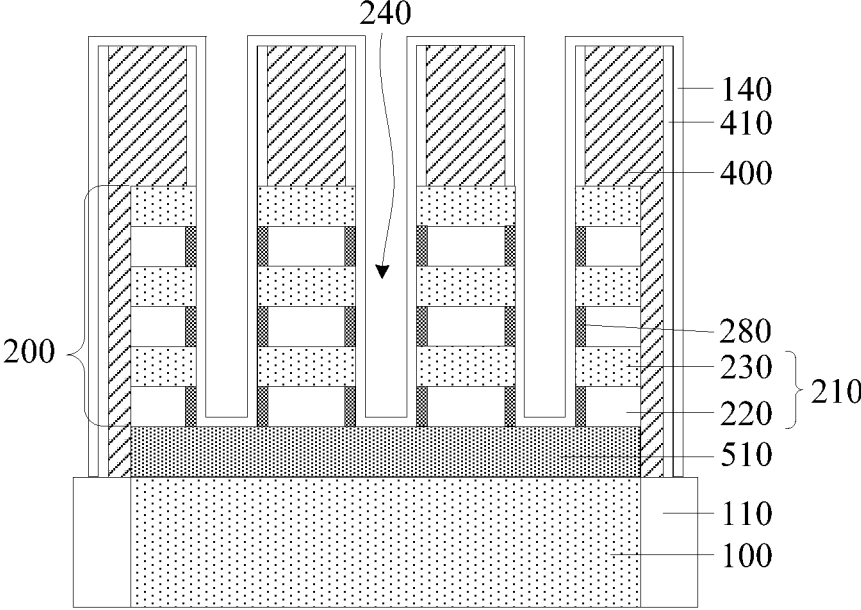
Figure 17:
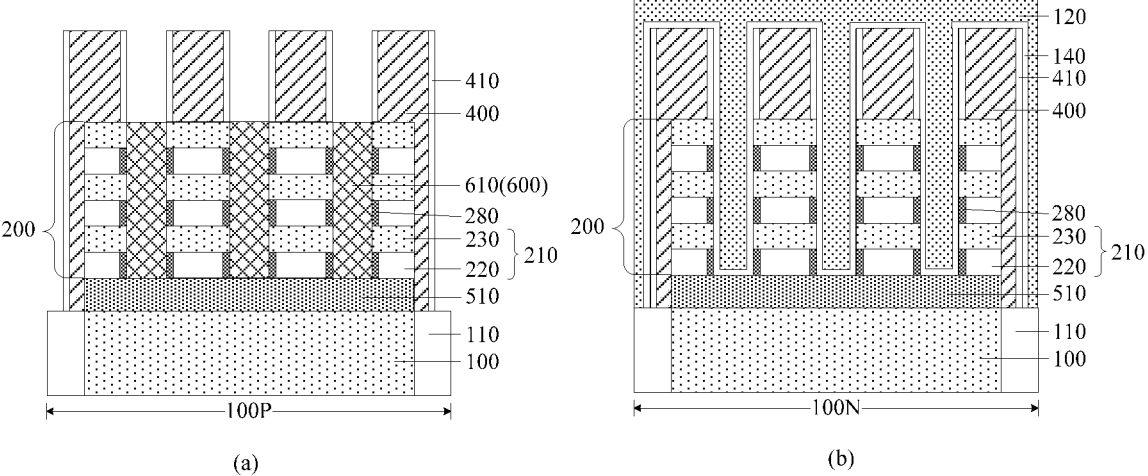
Figure 18:
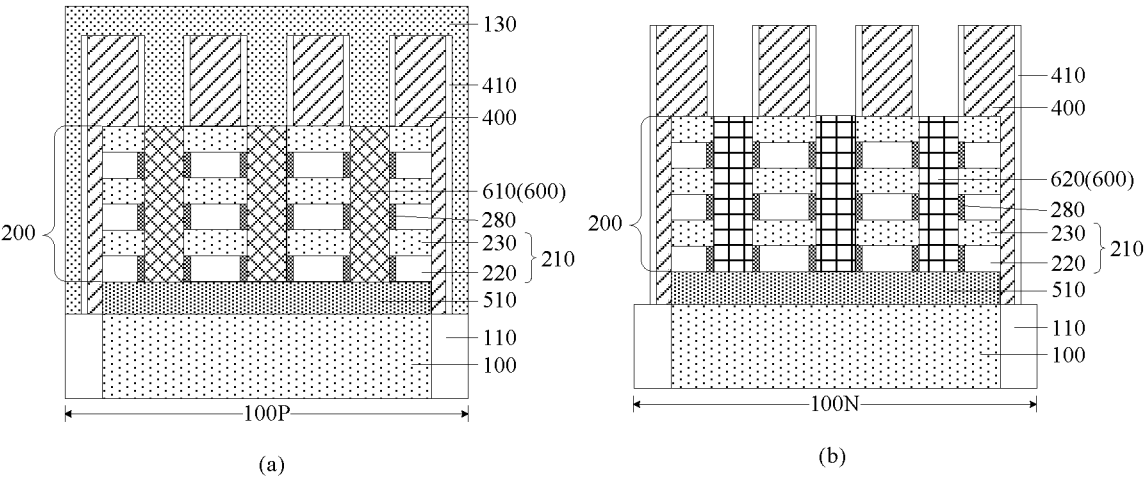

As shown in FIG. 16 to FIG. 18 which are cross-sectional views based on FIG. 15, after forming the isolation layers 510, source-drain doped layers 600 may be formed in the first grooves 240.

In one embodiment, the source-drain doped layers 600 may be formed in the first grooves 240 after forming the inner spacers 280.

The source-drain doped layers 600 may be used as sources or drains of the transistors.

In the first grooves 240, the source-drain doped layers 600 may be epitaxially grown using the channel layers 230 as an epitaxial growth base. Therefore, in one embodiment, when forming the source-drain doped layers 600, the source-drain doped layers 600 may contact the inner spacers 280.

The doping type of one source-drain doped layer 600 may be the same as the channel conductivity type of the corresponding transistor. Specifically, when the base substrate 100 is used to form an NMOS transistor, the dopant ions in the source-drain doped layer 600 may be N-type ions, and the N-type ions may include P ions, As ions or Sb ions. When the base substrate 100 is used to form a PMOS transistor, the dopant ions in the source-drain doped layer 600 may be P-type ions, and the P-type ions may include B ions, Ga ions or In ions.

In one embodiment, when the base substrate 100 is used to form an NMOS transistor, the material of the source-drain doped layer 600 may be Si or SiC doped with N-type ions, and the source-drain doped layer 600 may provide tensile stress for the corresponding channel region of the NMOS transistor, which may be beneficial to improving the carrier mobility of the NMOS transistor. When the substrate is used to form a PMOS transistor, the material of the source-drain doped layer 600 may be Si or SiGe doped with P-type ions.

The source-drain doped layer 600 may provide compressive stress for the channel region of the PMOS transistor, thereby helping to improve the carrier mobility of the PMOS transistor.

In one embodiment, when forming the source-drain doped layers 600, first source-drain doped layers 610 may be formed in the first device region 100P, and second source-drain doped layers 620 may be formed in the second device region 100N.

In one embodiment, the first transistor may be a PMOS transistor, P-type ions in the first source-drain doped layers 610 may include B ions, and the first source-drain doped layers 610 may be made of a material including SiGe doped with B ions. The second transistor may be an NMOS transistor, the N-type ions in the second source-drain doped layers 620 may be P ions, and the second source-drain doped layers 620 may be made of a material including Si doped with P ions.

In one embodiment, as shown in FIG. 16, forming the first source-drain doped layers 610 and the second source-drain doped layers 620 may include: forming a protective layer 140 covering the sidewalls and tops of the dummy gate structures 400 and the sidewalls and bottoms of the first grooves 240 in the first device region 100P and the second device region 100N.

The protective layer 140 may protect the first grooves 240, reducing contamination on the first grooves 240 in the second device region 100N due to the first mask layer subsequently formed and reducing the impact on the second source-drain doped layers 620.

In one embodiment, an atomic layer deposition process may be used to form the protective layer such that the thickness of the protective layer 140 is uniform. Further, the atomic layer deposition process may have a good step coverage capability, such that the protective layer 140 is able to better conformably cover the sidewalls and tops of the dummy gate structures 400 and the sidewalls and bottoms of the first grooves 240.

In one embodiment, the protective layer may be made of a material including SiC, SiCO, SiCON, BN, or BCN.

As shown in FIG. 17, forming the first source-drain doped layers 610 and the second source-drain doped layers 620 may further include: forming a first mask layer 120 covering the protective layer 140 in the second device region 100N. The first mask layer 120 may fill the first grooves 240 and may expose the first device region 100P.

The first mask layer may cover the second device region 100N to prevent the second device region 100N from being affected, when forming the first source-drain doped layers 610.

In one embodiment, the first mask layer 120 may be a stacked structure, and may include a planarization layer (not shown) and a photoresist layer (not shown) on the planarization layer.

In one embodiment, the planarization layer may be made of a material including spin-on-carbon (SOC) material. The spin-on-carbon material may be formed by spin coating process which may have a low cost. Further, using the spin-on-carbon material may improve the flatness of the top surface of the planarization layer, thereby providing a flat surface for forming the photoresist layer and improving the photolithography effect. Further, by using spin-coated carbon, there may be no need to use chemical mechanical polishing process for planarization, improving process efficiency.

As shown in FIG. 17, after forming the first mask layer 120, a portion of the protective layer 120 in the first device region 100P may be removed. After removing the portion of the protective layer 120 in the first device region 100P, the first source-drain doped layers 610 may be formed in the first grooves 240 in the first device region 100P.

After forming the source-drain doped layers 610, the first mask layer 120 and another portion of the protective layer 140 in the second device region 100N may be removed, to prepare for forming the second source-drain doped layers 620.

As shown in FIG. 18, after removing the first mask layer 120 and the portion of the protective layer 140 in the second device region 100N, a second mask layer 130 may be formed to cover the first device region 100P. The second mask layer 130 may cover the first source-drain doped layers 610 and expose the second device region 100N.

The second mask layer 130 may cover the first device region 100P to prevent the first device region 100P from being affected when forming the second source-drain doped layer 620.

When forming the second mask layer 130, the second mask layer 130 may be made of a material including SiN or SiNC. SiN or SiNC may form an etching selectivity ratio with other materials of the semiconductor structure, to reduce damage to the semiconductor structure when subsequently remove the second mask layer 130.

As shown in FIG. 18, after forming the second mask layer 130, the second source-drain doping layers 620 may be formed in the first grooves 240 of the second device region 100N.

After the second source-drain doping layers 620 are formed, the second mask layer 130 may be removed to prepare for forming the gate structures.

Figure 19:
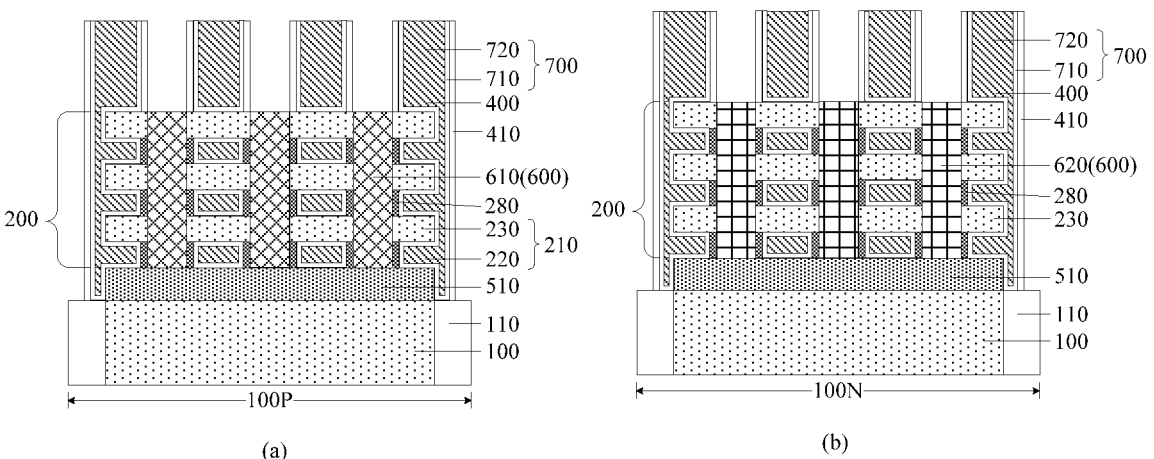

As shown in FIG. 19, the dummy gate structures 400 may be removed to form gate opening (not shown). Then the second sacrificial layers 220 may be removed through the gate openings. After removing the second sacrificial layer 220, gate structures 700 may be formed in the gate openings. Each gate structure 700 may include a gate dielectric layer 710 surrounding the corresponding channel layers 230 along an extending direction of the gate structure 700, and a gate electrode layer 720 on the gate dielectric layer 710.

The gate structures 700 may be used to control the on or off of the channels of the transistors.

The gate structures 700 may surround and cover the channel layers 230. Therefore, the tops, bottoms and side walls of the channel layers 230 may all be used as channels, which increases the area in the channel layers 230 used as channels, thereby increasing the operating current of the semiconductor structure.

One gate dielectric layer 710 may be used to isolate one corresponding gate electrode layer 720 from corresponding channel layers 230, and isolate the corresponding gate electrode layer 720 from the base substrate 100.

The gate dielectric layer 711 may be made of a material including one or more of $HfO_2$, $ZrO_2$, HfSiO, HfSiON, HfTaO, HfTiO, HfZrO, $Al_2O_3$, $SiO_2$ or $La_2O_3$. In this embodiment, the gate dielectric layer 711 may include a high-k gate dielectric layer, and the material of the high-k gate dielectric layer may include a high-k dielectric material. The high-k dielectric material may be a dielectric material whose relative dielectric constant is greater than the relative dielectric constant of silicon oxide. The high-k gate dielectric layer may be made of a material including $HfO_2$, $ZrO_2$, HfSiO, HfSiON, HfTaO, HfTiO, HfZrO or $Al_2O_3$, etc.

It should be noted that the gate dielectric layer 710 may also include a gate oxide layer, and the gate oxide layer may be located between the high-k gate dielectric layer and the corresponding channel layers 230. In one embodiment, the gate oxide layer may be made of a material including silicon oxide.

In this embodiment, one gate structure 700 may be a metal gate structure. Therefore, the gate electrode layer 720 may be made of a material including one or more of TiN, TaN, Ta, Ti, TiAl, W, AL, TiSiN and TiAlC.

The gate electrode layer 720 may include a work function layer (not shown) and an electrode layer (not shown) located on the work function layer. The work function layer may be used to adjust the threshold voltage of one corresponding transistor, and the electrode layer may be used to extract the electricity of the metal gate structure.

In other embodiments, the gate electrode layer may only include a work function layer.

In some other embodiments, according to process requirements, the gate structure may also be a polysilicon gate structure.

Figure 20:
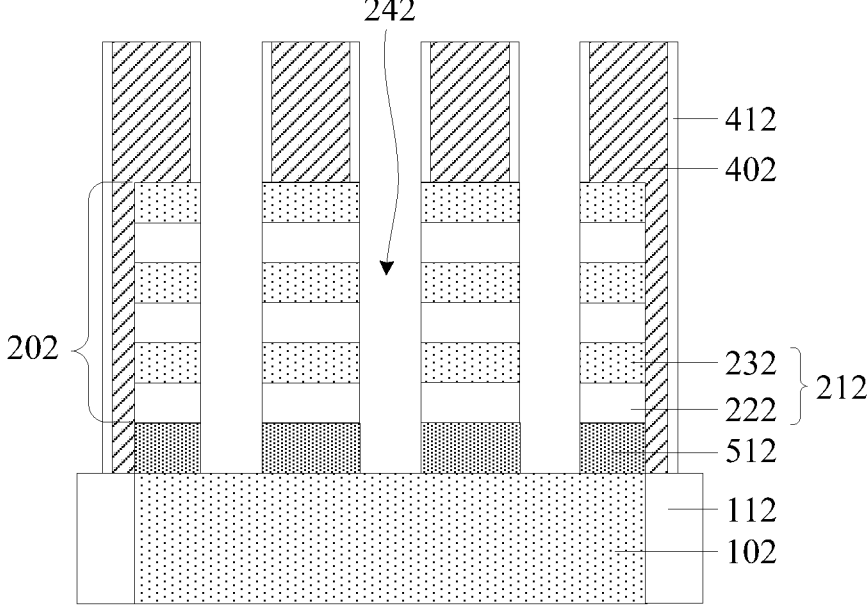
FIG. 20 to FIG. 21 illustrate structures corresponding to certain stages of another fabrication method of a semiconductor structure according to various disclosed embodiments of the present disclosure.
Figure 21:
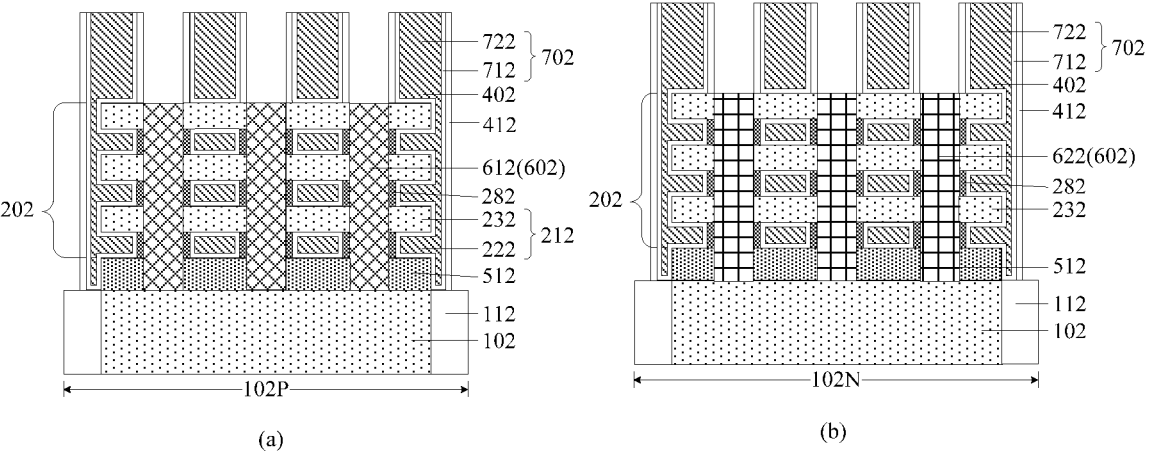

FIG. 20 and FIG. 21 illustrate structures corresponding to certain stage of another fabrication method of a semiconductor structure.

The similarities between this embodiment and the previous embodiments will not be described again here. The difference between this embodiment and the previous embodiments is that the isolation layers 512 may exposes the top surface of the base substrate 102.

As shown in FIG. 220, after forming the isolation layers 512 and before forming the source-drain doping layers, the method may further include: removing the isolation layers 512 at the bottoms of the first grooves 242 to expose the top surface of the base substrate 102 at the bottoms of the first grooves 242.

The isolation layers 512 at the bottoms of the first grooves 242 may be removed to expose the top surface of the base substrate 102 to prepare for the formation of the source-drain doped layers. Therefore, the source-drain doped layers may be grown on the top surface of the base substrate 102, improving the growth rate and formation quality of the source-drain doped layers.

In one embodiment, when removing the isolation layers 512 at the bottoms of the first grooves 242, a dry etching process may be used to remove the isolation layers 512 at the bottoms of the first grooves 242.

The dry etching process may be an anisotropic dry etching process. Therefore, the dry etching process may be beneficial to reducing damage to the base substrate 102 at the bottoms of the first grooves 242. At the same time, the dry etching process may be anisotropic, which may be beneficial to improving the sidewall topography quality and dimensional accuracy of the remaining isolation layers 512.

It should be noted that, after removing the isolation material layer between adjacent dummy gate structures 402 that is higher than the bottoms of the channel structures 202, when a part of the isolation material layer remains on the sidewalls of the first grooves 242 and is not completely removed, in the process of removing the isolation layers 512 at the bottoms of the first grooves 242, the isolation material layer between the adjacent dummy gate structures 402 and higher than the bottoms of the channel structures 202 may be further removed, to completely remove the isolation material layer above the bottoms of the channel structures 202.

As shown in FIG. 21, when forming the source-drain doped layers 602 in the first grooves 242, the source-drain doped layers 602 may be in contact with the top surface of the base substrate 102.

While the adjacent source-drain doped layers 602 are effectively isolated by the isolation layers 512, the source-drain doped layers 602 may be in contact with the base substrate 102, which may be beneficial to increasing the growth rate of the source-drain doped layers 602 and improving the growth quality of the source-drain doped layers 602 by reducing defects generated during the growth process.

For the specific description of the forming method in this embodiment, reference may be made to the corresponding descriptions in the foregoing embodiments, which will not be described again here.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A semiconductor structure, comprising:
   a base substrate including channel regions, wherein a normal direction of a surface of the base substrate is a longitudinal direction;
   isolation layers on the base substrate in the channel regions;
   channel layer structures located in the channel regions and suspended above the isolation layers, wherein each channel layer structure includes one or more channel layers arranged at intervals in the longitudinal direction;
   gate structures located on the base substrate and crossing the channel layer structures, wherein each gate structure includes a gate dielectric layer surrounding corresponding channel layers along an extending direction of the gate structure and a gate electrode layer located on the gate dielectric layer; and each gate structure is located on one corresponding isolation layer in one corresponding channel region; and
   source-drain doped layers in the base substrate on two sides of each gate structure, wherein, in an extending direction of the channel layer structures, the source-drain doped layers contact ends of the channel layer structures and ends of the isolation layers.

2. The semiconductor structure according to claim 1, further including inner spacers, wherein:
   in the longitudinal direction, the inner spacers are located between adjacent channel layers and between channel layers at the bottom and the corresponding isolation layers; and
   in the extending direction of the channel layer structures, the inner spacers are located between the gate structures and the source-drain doped layers.

3. The semiconductor structure according to claim 1, further including gate spacers, wherein:
   the gate spacers cover sidewalls of the gate structures; and
   a distance between the gate spacers on opposite sidewalls of adjacent gate structures is larger than a thickness of the isolation layers.

4. The semiconductor structure according to claim 1, wherein:
   the isolation layers are made of a material including a dielectric material.

5. The semiconductor structure according to claim 1, wherein:
   the isolation layers are made of a material including one or more of SiO2 or SiN.

6. The semiconductor structure according to claim 1, wherein:
   a thickness of the isolation layers is 5 nm to 15 nm.

7. The semiconductor structure according to claim 1, wherein:

the channel layers are made of a material including Si, Ge, SiGe, or an III-V semiconductor material.

8. The semiconductor structure according to claim 1, wherein:

the gate dielectric layer is made of a material including one or more of HfO2, ZrO2, HfSiO, HfSiON, HfTaO, HfTiO, HfZrO, Al2O3, SiO2 or La2O3; and the gate electrode layer is made of a material including one or more of TiN, TaN, Ta, Ti, TiAl, W, AL, TiSiN or TiAlC.

9. A fabrication method of a semiconductor structure, comprising:

providing a base substrate, wherein:

first sacrificial layers are formed on the base substrate, channel structures are formed on the first sacrificial layers;

each channel structure includes one or more stacked channel stack layers;

each channel stack layer includes a second sacrificial layer and a channel layer located on the second sacrificial layer;

dummy gate structures crossing the channel structures are also formed on the base substrate;

the dummy gate structures cover a portion of sidewalls and a portion of tops of the channel structures; and etching resistance of the first sacrificial layers is smaller than etching resistance of the second sacrificial layers, removing the channel structures and the first sacrificial layers on two sides of each dummy gate structure to form first grooves penetrating through the channel structures and the first sacrificial layers;

removing the first sacrificial layers at the bottoms of the channel structures through the first grooves, to form second grooves connected to the first grooves at the bottoms of the channel structures;

forming isolation layers in the second grooves; and after forming the isolation layers, forming source-drain doping layers in the first grooves.

10. The fabrication method of the semiconductor structure according to claim 9, wherein:

forming the isolation layers in the second grooves includes:

forming an isolation material layer covering sidewalls and tops of the dummy gate structures, the sidewalls of the channel structures, and a top of the base substrate exposed by the first grooves, wherein, the isolation material layer is also filled in the second grooves; and etching the isolation material layer to retain a portion of the isolation material layer in the second grooves and on the top of the base substrate exposed by the first grooves as the isolation layers, wherein the isolation layers expose the sidewalls of the channel structures.

11. The fabrication method of the semiconductor structure according to claim 10, wherein:

etching the isolation material layer includes:

performing a first etch on the isolation material layer, to remove a portion of the height of the isolation material layer between the adjacent dummy gate structures and close to the tops of the dummy gate structures to form openings; and after forming the openings, performing a second etch on the isolation material layer to remove the isolation material layer higher than the bottoms of the channel structures.

12. The fabrication method of the semiconductor structure according to claim 10, after forming the isolation layers and before forming the source-drain doped layer, further including:

removing the isolation layers at the bottoms of the first grooves, to expose the top surface of the base substrate, wherein:

when forming the source-drain doped layers in the first grooves, the source-drain doped layers contact the top surface of the base substrate.

13. The fabrication method of the semiconductor structure according to claim 10, wherein:

when providing the base substrate, gate spacers covering the tops and sidewalls of the dummy gate structures are formed on the base substrate; and when forming the isolation material layer, the isolation material layer also covers the gate spacers.

14. The fabrication method of the semiconductor structure according to claim 13, wherein:

when providing the base substrate, a distance between gate spacers on opposite sidewalls of adjacent dummy gate structures is larger than a thickness of the first sacrificial layers; and when forming the isolation material layer covering the sidewalls and tops of the dummy gate structures, the sidewalls of the channel structures, and a top of the substrate exposed by the first grooves, there are gaps between the isolation material layer on the sidewalls of the adjacent dummy gate structures.

15. The fabrication method of the semiconductor structure according to claim 9, after forming the isolation layers and before forming the source-drain doped layers, further including:

along a direction perpendicular to the sidewalls of the dummy gate structures, through the first grooves, removing a portion of the second sacrificial layers exposed by the sidewalls of the channel structures to form third grooves; and forming inner spacers in the third grooves, wherein:

when forming the source-drain doped layers, the source-drain doped layers are in contact with the inner spacers.

16. The fabrication method of the semiconductor structure according to claim 9, wherein:

when providing the base substrate, the base substrate includes a first device region for forming a first transistor and a second device region for forming a second transistor;

forming the source-drain doped layers includes forming first source-drain doped layers in the first device region and second source-drain doped layers in the second device region; and forming the first source-drain doped layers in the first device region and the second source-drain doped layers in the second device region includes:

forming a protective layer covering the sidewalls and tops of the dummy gate structures and the sidewalls and bottoms of the first grooves in the first device region and the second device region;

forming a first mask layer covering the protective layer in the second device region, wherein the first mask layer fills the first grooves and exposes the first device region;

removing the protective layer in the first device region after forming the first mask layer;

forming the first source-drain doped layers in the first grooves in the first device region after removing the protective layer in the first device region;

removing the first mask layer and the protective layer in the second device region after forming the first source-drain doped layers;

forming a second mask layer covering the first device region after removing the first mask layer and the protective layer in the second device region, wherein the second mask layer covers the first source-drain doped layers and exposes the second device region;

forming the second source-drain doped layers in the first grooves in the second device region after forming the second mask layer; and removing the second mask layer after forming the second source-drain doped layers.

17. The fabrication method of the semiconductor structure according to claim 9, wherein:

when removing the channel structures and the first sacrificial layers on two sides of each dummy gate structure, a dry etching process is used to remove the channel structures and the first sacrificial layers on two sides of each dummy gate structure.

18. The fabrication method of the semiconductor structure according to claim 9, wherein:

when removing the first sacrificial layers through the first grooves, an isotropic etching process is used to remove the first sacrificial layers.

19. The fabrication method of the semiconductor structure according to claim 10, wherein:

when forming the isolation material layer, an atomic layer deposition process is used to form the isolation material layer.

20. The fabrication method of the semiconductor structure according to claim 11, wherein:

when performing the first etch on the isolation material layer, a dry etching process is used to remove the portion of the height of the isolation material layer between the adjacent dummy gate structures and close to the tops of the dummy gate structures.

* * * * *